United States Patent
Masubuchi

(10) Patent No.: US 12,375,079 B2
(45) Date of Patent: Jul. 29, 2025

(54) SEMICONDUCTOR DEVICE AND INTEGRATED CIRCUIT

(71) Applicant: Hitachi Astemo, Ltd., Hitachinaka (JP)

(72) Inventor: Takumi Masubuchi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 17 days.

(21) Appl. No.: 18/285,783

(22) PCT Filed: Aug. 5, 2021

(86) PCT No.: PCT/JP2021/029194
§ 371 (c)(1),
(2) Date: Oct. 5, 2023

(87) PCT Pub. No.: WO2023/012987
PCT Pub. Date: Feb. 9, 2023

(65) Prior Publication Data
US 2024/0372547 A1 Nov. 7, 2024

(51) Int. Cl.
*H03K 17/08* (2006.01)
*H03K 17/14* (2006.01)
*H03K 17/687* (2006.01)

(52) U.S. Cl.
CPC ....... *H03K 17/6871* (2013.01); *H03K 17/145* (2013.01); *H03K 2017/0806* (2013.01)

(58) Field of Classification Search
CPC ...... H03K 17/08; H03K 17/14; H03K 17/145; H03K 17/687; H03K 17/6871; H03K 2017/0806

(Continued)

(56) References Cited

U.S. PATENT DOCUMENTS 5,309,068 A * 5/1994 Hakkarainen .......... H01H 9/542
                                                    315/226
5,604,890 A * 2/1997 Miller .................... G06F 9/441
                                                    703/23

(Continued)

FOREIGN PATENT DOCUMENTS

JP  2008-283743 A  11/2008
JP  2017-46564 A   3/2017

(Continued)

OTHER PUBLICATIONS

International Search Report (PCT/ISA/210) issued in PCT Application No. PCT/JP2021/029194 dated Oct. 19, 2021 with English translation (4 pages).

(Continued)

*Primary Examiner* — William Hernandez
(74) *Attorney, Agent, or Firm* — Crowell & Moring LLP

(57) ABSTRACT

A first semiconductor relay and a second semiconductor relay connected in parallel to each other, an input switching circuit that switches a path of a signal input to the first and second semiconductor relays, an output switching circuit that switches a path of a signal output from the first and second semiconductor relays, and a monitoring unit that performs abnormality detection and warning for the first and second semiconductor relays are provided. In addition, one of a redundancy mode in which the input switching circuit is controlled such that inputs of the first and second semiconductor relays are shared in response to a first setting signal from the outside and the output switching circuit is controlled such that only one of the first and second semiconductor relays performs output and a non-redundancy mode in which the input switching circuit and the output switching circuit are controlled such that inputs and outputs (Continued)

of the first and second semiconductor relays are different from each other is implemented.

7 Claims, 13 Drawing Sheets

(58) Field of Classification Search
USPC .................................................. 327/403, 404
See application file for complete search history.

(56) References Cited

U.S. PATENT DOCUMENTS

| | | | |
|---|---|---|---|
| 5,633,540 A * | 5/1997 | Moan | H02P 7/295 |
| | | | 361/13 |
| 7,737,664 B2 | 6/2010 | Matsunaga | |
| 2008/0278116 A1 | 11/2008 | Matsunaga | |
| 2016/0057841 A1* | 2/2016 | Lenig | H05B 45/10 |
| | | | 315/291 |
| 2016/0344184 A1* | 11/2016 | Sundara Moorthy | H02J 9/005 |

FOREIGN PATENT DOCUMENTS

| | | |
|---|---|---|
| JP | 2019-135820 A | 8/2019 |
| WO | WO 2020/137506 A1 | 7/2020 |

OTHER PUBLICATIONS

Japanese-language Written Opinion (PCT/ISA/237) issued in PCT Application No. PCT/JP2021/029194 dated Oct. 19, 2021 with English translation (5 pages).

* cited by examiner

FIG. 4

| | | | SWITCH SETTING | | | | |
|---|---|---|---|---|---|---|---|
| | | | No.1 | No.2 | No.3 | No.4 | No.5 |
| INPUT OF CONTROL CIRCUIT 30 | (1) REDUNDANCY MODE SETTING SIGNAL (30a) | | H | H | H | H | L |
| | (2) INPUT/OUTPUT COMMON-SETTING SIGNAL (30b) | | L | L | H | H | * |
| | (3) OUTPUT OF ABNORMALITY WARNING OF SEMICONDUCTOR RELAY 1 (71b) | | L | H | L | H | * |
| CONTROL CONTENT OF EACH SWITCH | INPUT SWITCHING CIRCUIT 10 | SWITCH S1 | ON | ON | ON | ON | ON |
| | | SWITCH S2 | OFF | OFF | ON | ON | ON |
| | | SWITCH S3 | ON | ON | ON | ON | OFF |
| | OUTPUT SWITCHING CIRCUIT 20 | SWITCH SU11, SL11 | ON | ON | ON | ON | ON |
| | | SWITCH SU12, SL12 | OFF | ON | OFF | ON | ON |
| | | SWITCH SU21, SL21 | OFF | OFF | ON | OFF | ON |
| | | SWITCH SU22, SL22 | OFF | ON | ON | ON | ON |
| | | SWITCH SU3, SL3 | OFF | ON | ON | ON | OFF |

SEMICONDUCTOR DEVICE AND INTEGRATED CIRCUIT

TECHNICAL FIELD

The present invention relates to a semiconductor device including semiconductor relays to perform control such that two points enter either an electrically conductive state or non-conductive state, and an integrated circuit in which the semiconductor relays are integrated.

BACKGROUND ART

Currently, electric and electronic architectures in automobiles have been going through the era of innovation. For example, companies have studied beginning from the conventional flat hierarchical structure architecture to a domain architecture in which an integrated engine control unit (ECU) is provided for each function and to a zone architecture in which an integrated ECU is provided for each area in the inside of vehicles. In addition, in the trend of ECU integration, component arrangement has been studied again, and in particular, it has been started to specifically study semiconductor relays particularly regarding mechanical relays and fuses.

PTL 1 describes a case of a relay circuit configured by using an expensive semiconductor relay that can block a high current designed to avoid an increase in manufacturing costs. The relay circuit described in PTL 1 includes a breaker including a first relay (mechanical relay) and a second relay (semiconductor relay) connected to each other, and a controller that controls operations of the breaker. In addition, when a current path is blocked, the controller switches the first relay from an OFF state to an ON state, then the second relay from an ON state to an OFF state, and then switches the first relay from the ON state to an OFF state. In addition, when the controller determines that the mechanical relay does not need to be switched on due to the temperature of the semiconductor relay or the current flowing through the semiconductor relay at the time when the current path is blocked, the controller switches the semiconductor relay from the ON state to the OFF state while maintaining the mechanical relay in the OFF state.

CITATION LIST

Patent Literature

PTL 1: JP 2017-46564 A

SUMMARY OF INVENTION

Technical Problem

However, conventional fuses including the relay circuit described in PTL 1 are so-called fail-safe devices that stop their function by being fused due to overcurrent. However, at the autonomous driving level 3 or higher, which is expected to become widespread in the future, it is easily assumed that some functions will be required to be continuously active even when an abnormality occurs, that is, fail operation will be required. Therefore, when a fuse is made into a semiconductor relay, not only fail safe but also fail operation needs to be provided.

An object of the present invention is to provide a semiconductor device and an integrated circuit including a semiconductor relay capable of switching to an alternative system without interrupting a function when a main system is abnormal.

Solution to Problem

In order to solve the above problem, for example, the configurations described in the claims are adopted. Although the present application includes a plurality of means for solving the problem, one example thereof is a semiconductor device of the present invention including a first semiconductor relay and a second semiconductor relay connected in parallel to each other, an input switching circuit which switches a path of a signal input to the first and second semiconductor relays, an output switching circuit which switches a path of a signal output from the first and second semiconductor relays, a monitoring unit which performs abnormality detection and warning for the first and second semiconductor relays, and a control circuit which executes one of a redundancy mode in which the input switching circuit is controlled such that inputs of the first and second semiconductor relays are shared in response to a first setting signal from the outside and the output switching circuit is controlled such that only one of the first and second semiconductor relays performs output and a non-redundancy mode in which the input switching circuit and the output switching circuit are controlled such that inputs and outputs of the first and second semiconductor relays are different from each other.

Advantageous Effects of Invention

By using the semiconductor device according to the present invention, it is possible to provide a semiconductor device including semiconductor relays that constitute a redundant system to switch to an alternative system without interrupting a function when a main system is abnormal. As a result, the present invention can be applied to a function requiring a fail operation in a vehicle system. Furthermore, by enabling the same semiconductor device to be used as a non-redundant semiconductor relay configuration having a 2-ch configuration, the semiconductor device can be applied as a system with different requirements due to different uses of the same components, and thus applied to a wide range of systems.

Problems, configurations, and effects other than those described above will be clarified by the following description of embodiments.

BRIEF DESCRIPTION OF DRAWINGS

FIG. 4 is a configuration diagram of a table describing control contents of the input switching circuit 10 and the output switching circuit 20 by a control circuit 30 according to the first embodiment.

DESCRIPTION OF EMBODIMENTS

Hereinafter, as an embodiment of a semiconductor device of the present invention, a semiconductor device including a semiconductor relay that constitutes a redundant system and can be switched to an alternative system without interrupting the functions when a main system is abnormal will be described.

By providing the semiconductor device of the present invention, it is possible to apply the semiconductor device to a function requiring a fail operation in a vehicle system, and it is also possible to use the same semiconductor device as a non-redundant semiconductor relay configuration having a 2-ch configuration, so that the semiconductor device can be applied to systems requiring different requirements by using the same component in different ways.

First Embodiment of Present Invention

In the first embodiment (hereinafter, referred to as "present example") of the present invention, in a case where the operation mode of a semiconductor device 100 is set to a redundancy mode and an abnormality occurs in the semiconductor relay of the main system, the mode is switched to an alternative system without interrupting the relay function, and the operation at the time of switching will be described.

In the redundancy mode in the present invention, among the two semiconductor relays which are some of the components of the semiconductor device 100, the semiconductor relay 1 takes in charge of a relay function as a main system to control a conductive or non-conductive state of the two points, and the semiconductor relay 2 is in an operation mode in which the semiconductor relay 2 serves as an alternative system to the semiconductor relay 1 in a functional standby state in preparation for an abnormality of the main system.

That is, in the semiconductor device 100 of the present example, the semiconductor relay 1 is assumed to be the main system and the semiconductor relay 2 is assumed to be the alternative system for the sake of simplicity of description, but there is no problem in operating the semiconductor relay 2 as the main system and the semiconductor relay 1 as the alternative system. Furthermore, a signal for setting and control in the description of the semiconductor device 100 of the present example is assumed to be binary logic, and will be described on the assumption that the setting and control are enabled at a high level (referred to as an H level or H below) and are disabled at a low level (referred to as a L level or L below).

Overall Configuration and Function of Semiconductor Device 100

Figure 1:
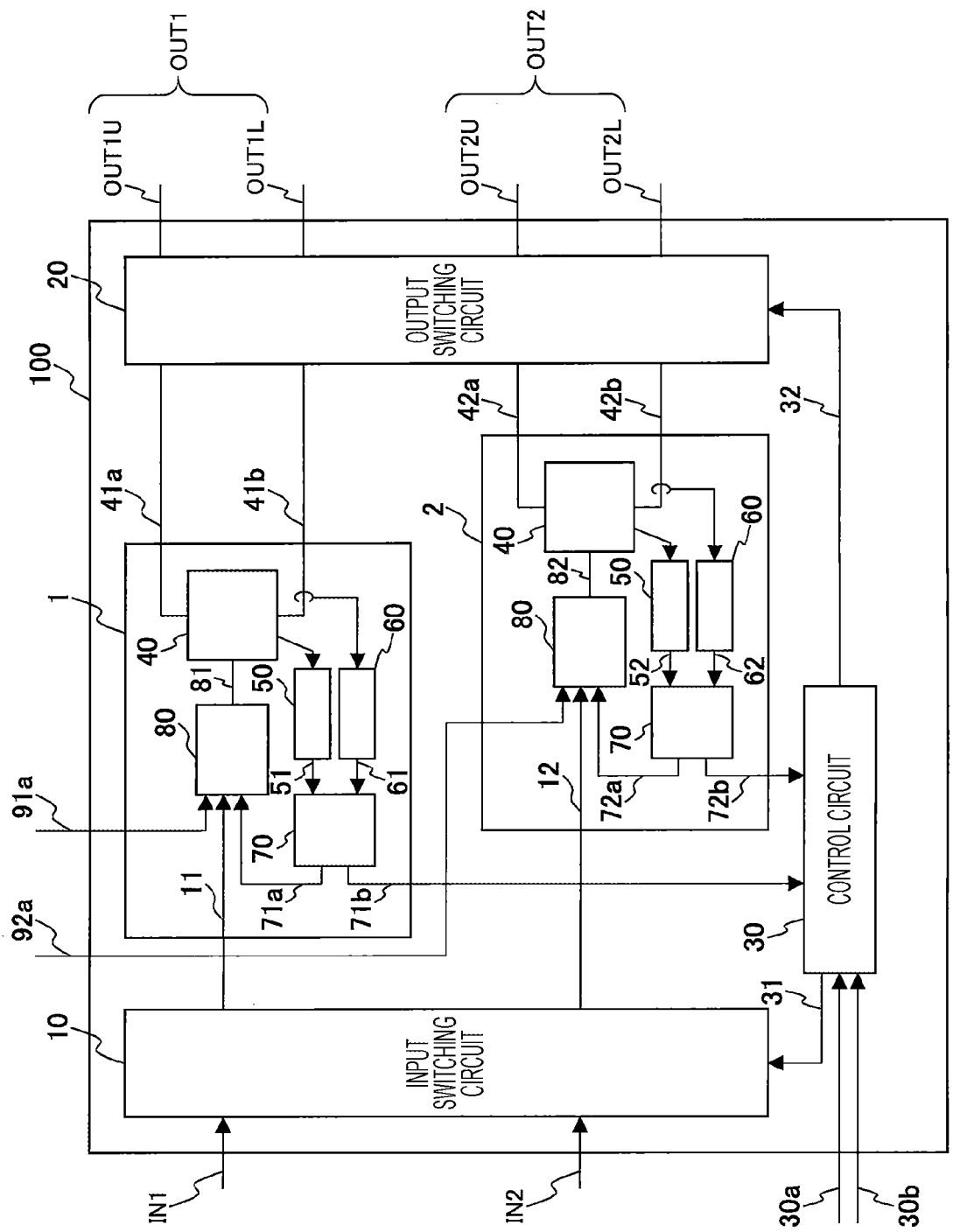
FIG. 1 is a block diagram illustrating an example of a configuration of a semiconductor device according to a first embodiment of the present invention.

FIG. 1 is a block diagram illustrating an example of a configuration of the semiconductor device 100 according to the present example. As illustrated in FIG. 1, the semiconductor device 100 includes two semiconductor relays 1 and 2, an input switching circuit 10, an output switching circuit 20, and a control circuit 30.

As signals used for connection between the semiconductor device 100 and the outside thereof, semiconductor relay control signals IN1 and IN2 and two output signal pairs OUT1 and OUT2 are provided. Furthermore, the semiconductor device includes a redundancy mode setting signal 30a for setting whether the semiconductor relays 1 and 2 operate in the redundancy mode including the main system and the alternative system, and emergency stop signals 91a and 92a which are input signals for an emergency stop of the semiconductor relay 1 and the semiconductor relay 2 from the outside of the semiconductor device 100. That is, it can be said that the redundancy mode setting signal 30a is a signal for determining whether to cause the semiconductor relay 1 and the semiconductor relay 2 to operate in the redundancy mode or in a non-redundancy mode to be described later.

Furthermore, the semiconductor device 100 operating in the redundancy mode includes an input/output common-setting signal 30b for setting whether to use the semiconductor relay control signals IN1 and IN2 as a common input signal and the output signal pairs OUT1 and OUT2 as a common output signal pair. In addition, the output signal pair OUT1 includes two output signals OUT1U and OUT1L, and the output signal pair OUT2 includes two signals OUT2U and OUT2L. That is, the input/output common-setting signal 30b is a signal for controlling the input switching circuit 10 and the output switching circuit 20 such that inputs and outputs of the semiconductor relay 1 and the semiconductor relay 2 are dual systems. Here, as superordinate terms, the redundancy mode setting signal 30a is referred to as a first setting signal, and the input/output common-setting signal 30b is referred to as a second setting signal.

Figure 2:
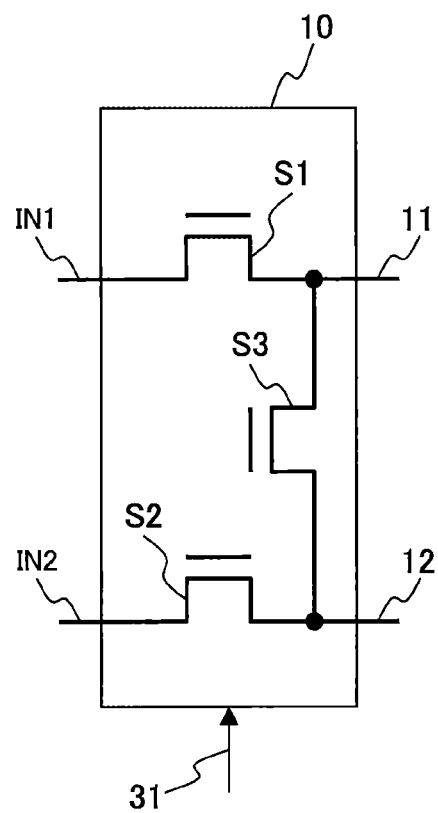
FIG. 2 is a diagram illustrating an example of a configuration of an input switching circuit 10 according to the first embodiment.

The input switching circuit 10 receives the semiconductor relay control signals IN1 and IN2 and an input unit control signal 31 from the control circuit 30 as inputs, and outputs drive signals 11 and 12 for instructing the semiconductor relays 1 and 2 to drive. For example, the input switching circuit 10 is configured to include switches S1, S2, and S3 as illustrated in FIG. 2, and an ON or OFF state of each switch of the input switching circuit 10 is controlled by the input unit control signal 31 from the control circuit 30.

The output switching circuit 20 receives semiconductor relay outputs 41a and 41b output from the semiconductor relay 1 and semiconductor relay outputs 42a and 42b output from the semiconductor relay 2 as inputs, and outputs the output signal pairs OUT1 and OUT2.

Figure 3:
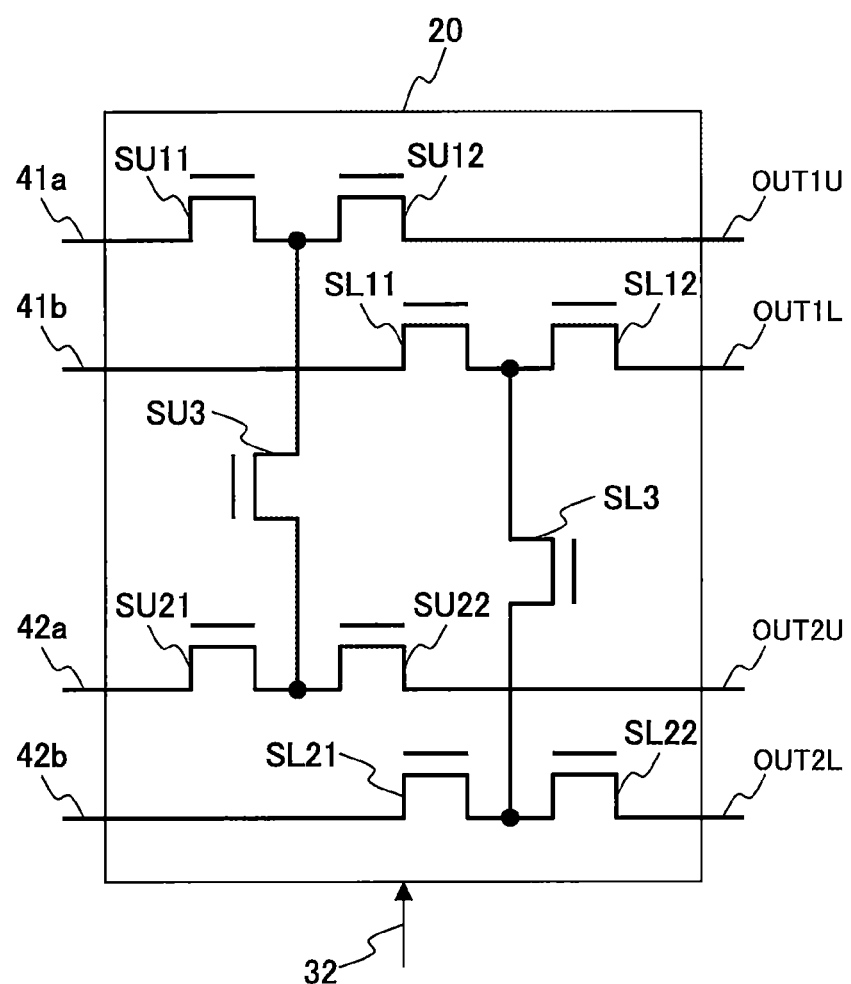
FIG. 3 is a diagram illustrating an example of a configuration of an output switching circuit 20 according to the first embodiment.

For example, as illustrated in FIG. 3, the output switching circuit 20 in the semiconductor device 100 of the present example is configured to include switches SU11 to SU22, SU3, SL11 to SL22, and SL3. The ON or OFF state of each switch of the output switching circuit 20 is controlled by an output unit control signal 32 from the control circuit 30.

The control circuit 30 receives the redundancy mode setting signal 30a, the input/output common-setting signal 30b, and an abnormality warning signal 71b as inputs from the semiconductor relay 1. The control circuit 30 outputs the input unit control signal 31 and the output unit control signal 32 according to a combination of inputs including these three signals. As a result, the control circuit 30 controls each of the input switching circuit 10 and the output switching circuit 20 such that the circuits are in the states illustrated in FIG. 4 to be described later.

FIG. 4 is a configuration diagram of a table illustrating control contents when the control circuit 30 controls the ON/OFF states of each switch included in the input switching circuit 10 and the output switching circuit 20. The input switching circuit 10 and the output switching circuit 20 of the semiconductor device 100 of the present example select any of switch settings No. 1 to No. 5 illustrated in FIG. 4 according to a combination of the redundancy mode setting signal 30a, the input/output common-setting signal 30b, and the abnormality warning signal 71b.

Configuration and Function of Semiconductor Relay

Figure 5:
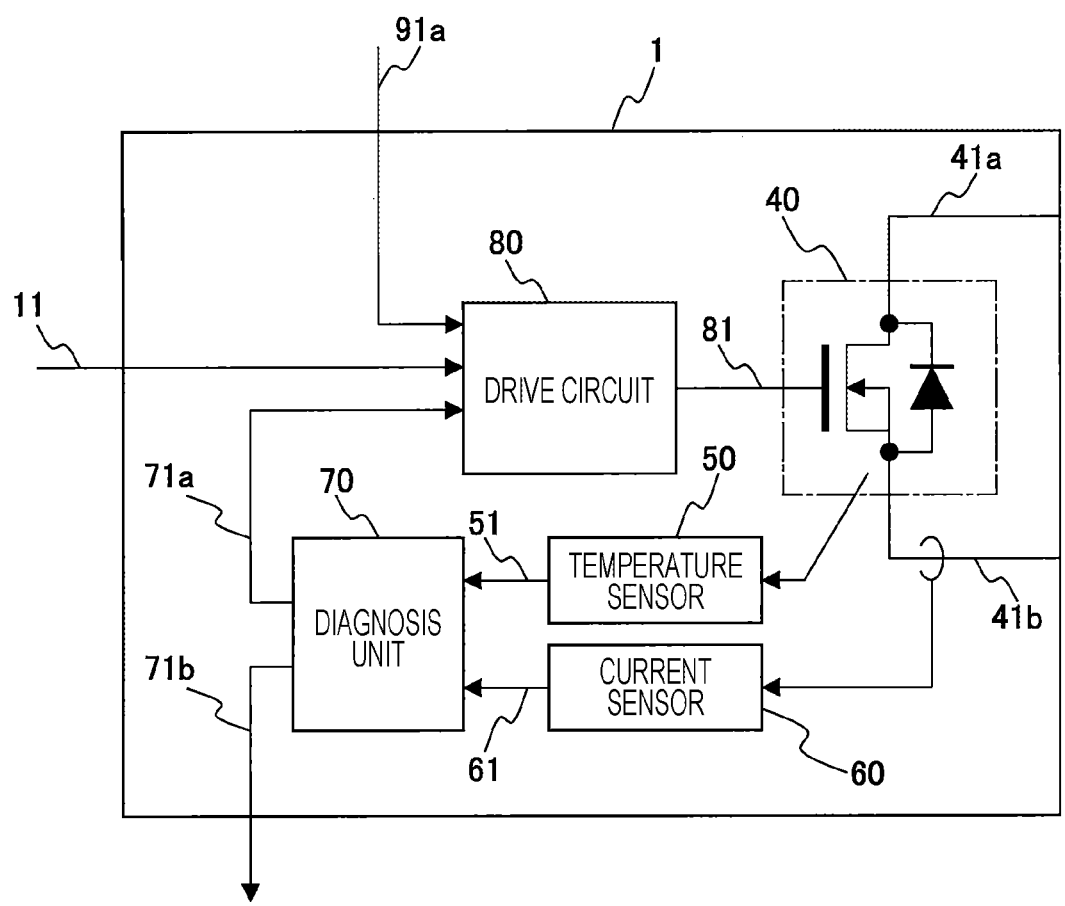
FIG. 5 is a diagram illustrating an example of a configuration of a semiconductor relay 1 according to the first embodiment.

FIG. 5 is a diagram illustrating a configuration example of the semiconductor relay 1 used in the semiconductor device 100 of the present example. The semiconductor relay 1 includes a switching element 40, a temperature sensor 50, a current sensor 60, a diagnosis unit 70, and a drive circuit 80. Here, the temperature sensor 50 constitutes a temperature detector, and the current sensor 60 constitutes a current detector. In addition, the temperature sensor 50, the current sensor 60, and the diagnosis unit 70 constitute a monitoring unit that performs abnormality detection and warning for each of the first semiconductor relay 1 and the second semiconductor relay 2.

Although the components of the two semiconductor relays 1 and 2 are the same, signal lines and control lines are denoted by different numbers for distinction in the description. Note that components other than the signal lines and the control lines are denoted by the same reference numerals.

Hereinafter, although each component of the semiconductor relay 1 will be described, each component of the semiconductor relay 2 is different from that of the semiconductor relay 1 only in the numbers attached to the signal lines or the control lines, and thus the description thereof will be omitted.

The switching element 40 is switched on or off based on a switching element control signal 81 output from the drive circuit 80, and performs control such that the two points of the semiconductor relay outputs 41a and 41b enter a conductive state or a non-conductive state. When the switching element 40 is switched on, the two points of the semiconductor relay outputs 41a and 41b are controlled such that the semiconductor relay outputs enter in the conductive state, and when the switching element 40 is switched off, the two points of the semiconductor relay outputs 41a and 41b are controlled such that the semiconductor relay outputs enter in the non-conductive state. Note that, in the semiconductor device 100 of this example, an N-channel MOSFET illustrated in FIG. 2, for example, is used as an example of the switching element 40.

The temperature sensor 50 detects the temperature of the switching element 40 and supplies a temperature detection result 51 to the diagnosis unit 70. In addition, the current sensor 60 detects a current flowing in the switching element 40 and supplies a current detection result 61 to the diagnosis unit 70.

Based on the temperature detection result 51 and the current detection result 61 supplied from the temperature sensor 50 and the current sensor 60, the diagnosis unit 70 outputs a drive stop signal and/or the abnormality warning signal 71b based on an abnormality diagnosis result 71a according to the results obtained by comparing the temperature and the current of the switching element 40 with predetermined thresholds.

In addition, the diagnosis unit 70 uses an overtemperature warning threshold 51a, an overtemperature diagnostic threshold 51b, an overcurrent warning threshold 61a, and an overcurrent diagnostic threshold 61b as thresholds for comparison. Here, the overtemperature diagnostic threshold 51b is a value larger than the overtemperature warning threshold 51a, and the overcurrent diagnostic threshold 61b is a value larger than the overcurrent warning threshold 61a.

Specifically, the diagnosis unit 70 compares the temperature detection result 51 with the overtemperature diagnostic threshold 51b, and diagnoses that the switching element 40 is in an overtemperature state when the temperature detection result 51 is a value equal to or greater than the overtemperature diagnostic threshold 51b.

In addition, the diagnosis unit 70 compares the current detection result 61 with the overcurrent diagnostic threshold 61b, and diagnoses that the switching element 40 is in an overcurrent state when the current detection result 61 is a value equal to or greater than the overcurrent diagnostic threshold 61b.

When diagnosing that the switching element 40 is in the overtemperature state and/or the overcurrent state, the diagnosis unit 70 outputs an abnormality diagnosis result 71a and an abnormality warning signal 71b as diagnosis information. Here, the abnormality diagnosis result 71a is output to the drive circuit 80. The drive circuit 80 performs control such that the switching element 40 enters the non-conductive state based on the abnormality diagnosis result 71a. In addition, the abnormality warning signal 71b is supplied to the control circuit 30 in FIG. 1, and is used for performing control of cutting off the input switching circuit 10 and the output switching circuit 20.

All of the overtemperature warning threshold 51a, the overtemperature diagnostic threshold 51b, the overcurrent warning threshold 61a, and the overcurrent diagnostic threshold 61b may be generated by providing a circuit inside the diagnosis unit 70, or may be generated outside the diagnosis unit 70 and input to the diagnosis unit 70. Note that these thresholds may be composed of an analog voltage value or a digital value including a plurality of bits.

The drive circuit 80 receives a drive signal 11, the abnormality diagnosis result 71a, and the emergency stop signal 91a as inputs, and the drive circuit 80 outputs the switching element control signal 81. Here, the emergency stop signal 91a is an H-level signal supplied from the load circuit side when an abnormality occurs at a load circuit to be driven by the semiconductor relay 1 and self-shut-off on the load circuit side becomes impossible.

When both the abnormality diagnosis result 71a and the emergency stop signal 91a are at the L level, the drive circuit 80 supplies the instruction of the drive signal 11 as it is to the switching element 40 as the switching element control signal 81, and controls ON and OFF states of the switching element 40.

In addition, when at least one of the abnormality diagnosis result 71a and the emergency stop signal 91a is at the H level, the drive circuit 80 outputs the switching element control signal 81 for switching the switching element 40 to the OFF state, regardless of the state of the drive signal 11. That is, the abnormality diagnosis result 71a and the emergency stop signal 91a have a function of forcibly switching off the switching element 40.

Flow of Diagnosis Process of Diagnosis Unit 70 of Semiconductor Relay

Figure 6:
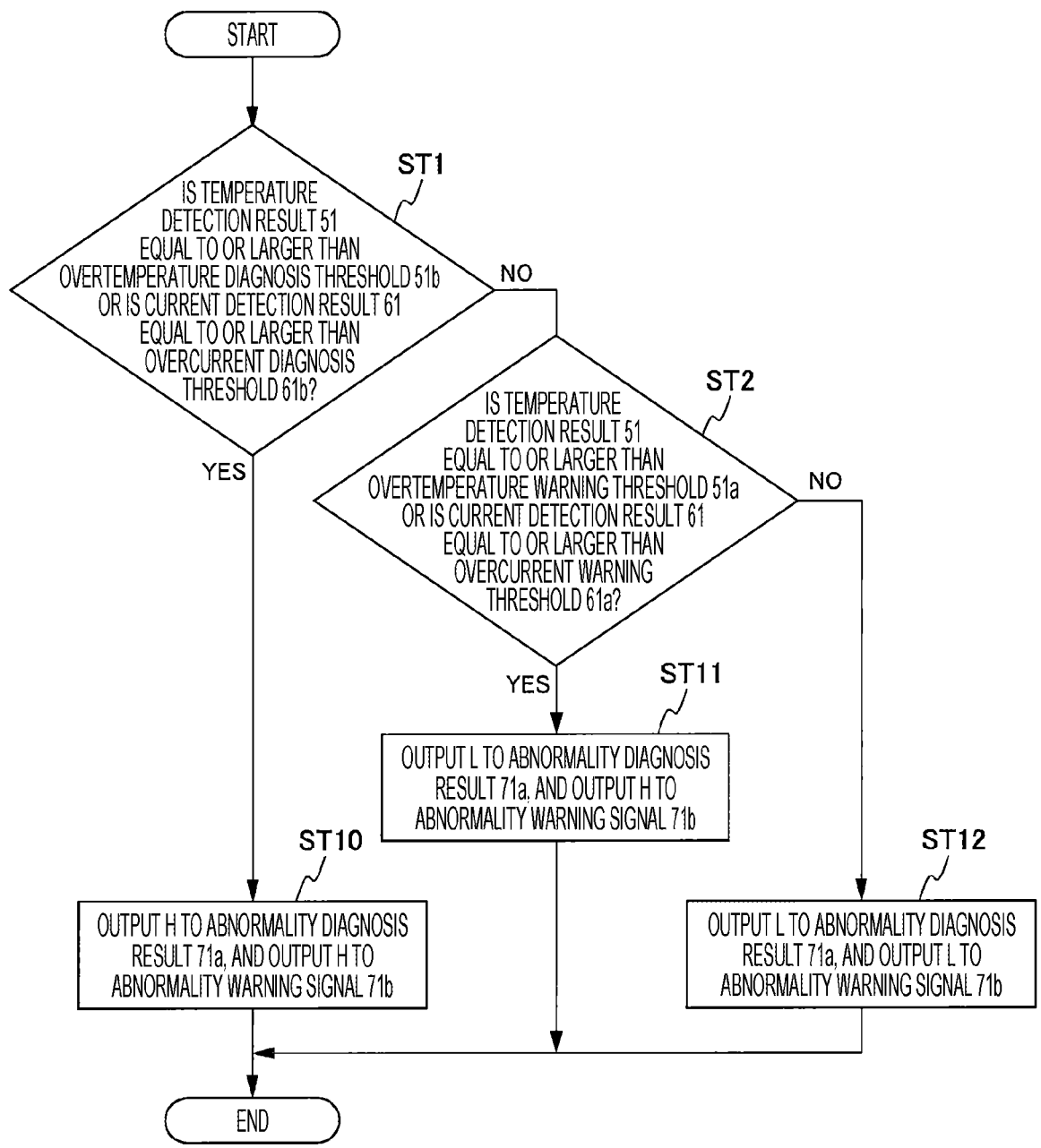
FIG. 6 is a flowchart showing the flow of a diagnosis process by a diagnosis unit 70 according to the first embodiment.

FIG. 6 is a flowchart illustrating the diagnosis flow of the diagnosis unit 70 of the semiconductor relay 1 of the semiconductor device 100 in the present example.

First, the diagnosis unit 70 of the semiconductor relay 1 diagnoses whether the temperature detection result 51 of the switching element 40 of the semiconductor relay 1 is equal to or more than the overtemperature diagnostic threshold 51b or the current detection result 61 is equal to or more than the overcurrent diagnostic threshold 61b (ST1). If the diagnosis unit 70 diagnoses that the result is in the overtemperature or overcurrent state (YES in ST1), the diagnosis unit 70 outputs the H level to both the abnormality diagnosis result 71a and the abnormality warning signal 71b (ST10).

If neither the overtemperature nor the overcurrent applies in step ST1 (NO in ST1), next, the diagnosis unit 70 diagnoses whether the temperature detection result 51 is equal to or greater than the overtemperature warning threshold 51a or the current detection result 61 is equal to or greater than the overcurrent warning threshold 61a (ST2).

If the diagnosis unit 70 determines that the result is in the overtemperature warning or the overcurrent warning state in step ST2 (YES in ST2), the diagnosis unit 70 outputs the H level to the abnormality warning signal 71b. In addition, since the result is not in the overtemperature and overcurrent state, the diagnosis unit 70 outputs the L level to the abnormality diagnosis result 71a (ST11).

If the diagnosis unit 70 diagnoses that both the temperature and the current are in the normal state in step ST2 (NO in ST2), the diagnosis unit 70 outputs the L level to both the abnormality diagnosis result 71a and the abnormality warning signal 71b (ST12). After the diagnosis for each state of ST10 to ST12 is confirmed, the flow of the diagnosis process of the diagnosis unit 70 ends.

In the semiconductor device 100 of the present example, when the semiconductor relay 1 of the main system enters the overtemperature warning state or the overcurrent warning state, the semiconductor relay 2 of the alternative system is also switched on. As a result, even when both the semiconductor relay 1 and the semiconductor relay 2 temporarily have a relay function and the semiconductor relay 1 is finally forcibly switched off due to overtemperature diagnosis or overcurrent diagnosis, it is possible to maintain the operation of the semiconductor device 100 due to the semiconductor relay 2 without temporally interrupting the relay function.

Hereinafter, a configuration and a function will be described using the configuration diagram of the semiconductor device 100 of the present example illustrated in FIG. 7 and the time chart illustrated in FIG. 8.

Figure 7:
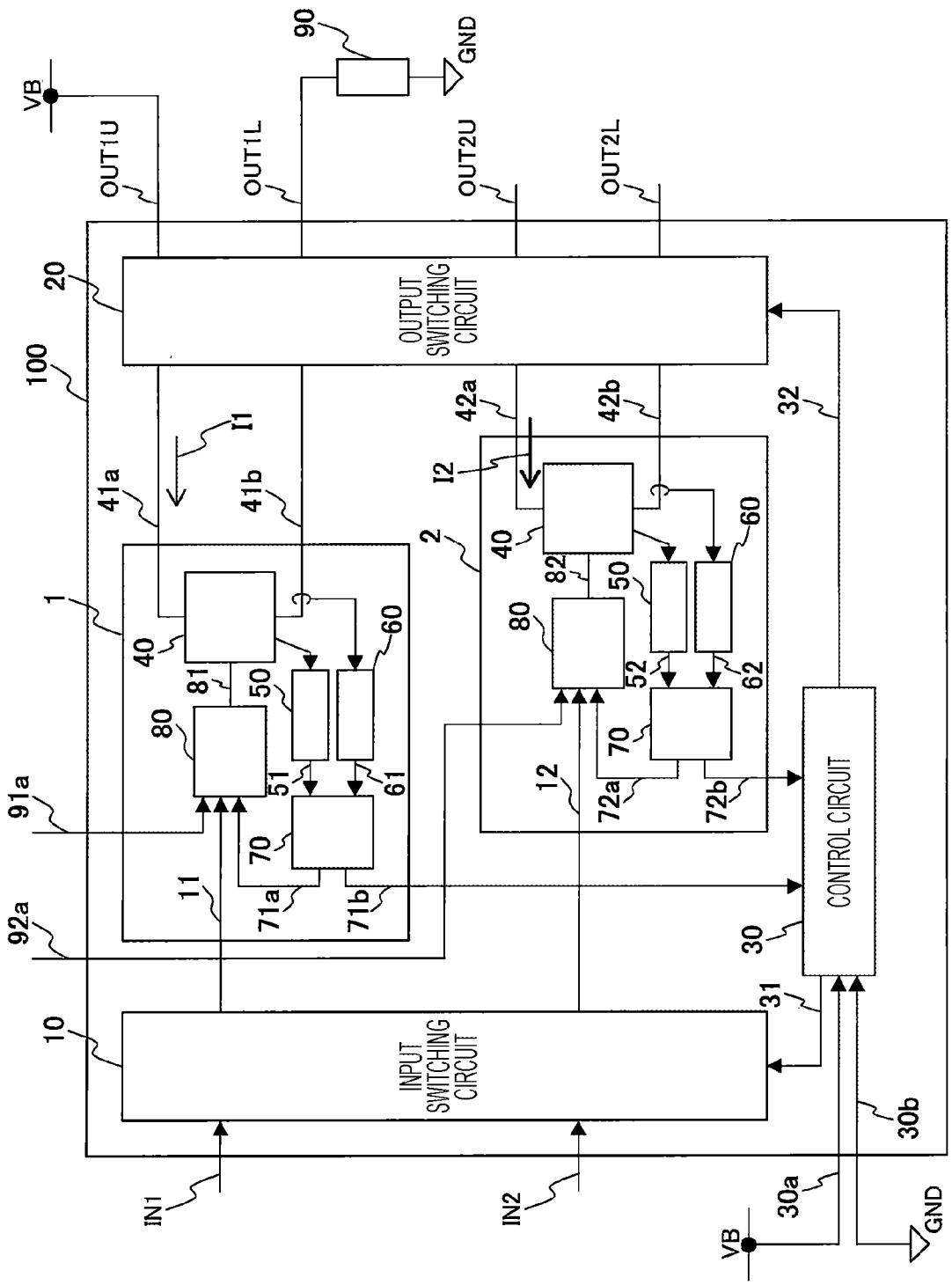
FIG. 7 is a diagram for describing a modified example of the configuration of the semiconductor device 100 according to the first embodiment.

FIG. 7 is a block diagram illustrating a modified example of the configuration of the semiconductor device 100 according to the present example. The difference from FIG. 1 is that, in the semiconductor device 100, one OUT1U of the relay outputs of the main system is connected to a battery voltage VB, and the other OUT1L is connected to a ground potential GND via a load 90.

For simplification of description, it is assumed that, among OUT1U and OUT1L, OUT1U is at a relatively higher potential than OUT1L. In addition, it is assumed that the redundancy mode setting signal 30a which is the first setting signal and the input/output common-setting signal 30b which is the second setting signal are connected to a power supply and have fixed potentials. As a result, an unintended mode change during the operation of the semiconductor device 100 can be suppressed.

In the semiconductor device 100 of the present example, the redundancy mode setting signal 30a is connected to the battery voltage VB, and the input/output common-setting signal 30b is connected to and fixed to the ground potential GND.

Figure 8A:
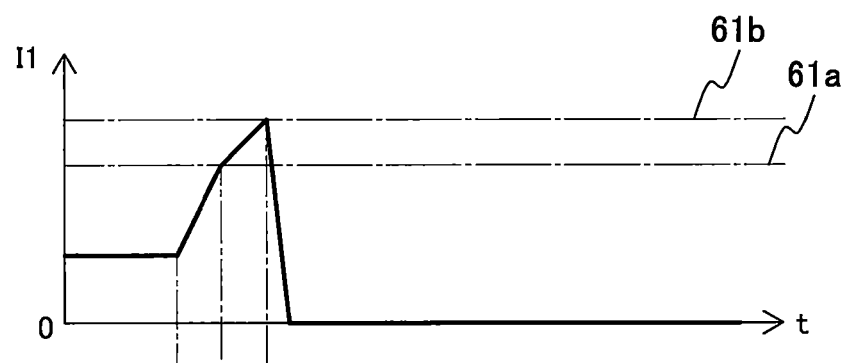
FIGS. 8A to 8C are time charts at the time of performing overcurrent diagnosis according to the first embodiment.
Figure 8B:
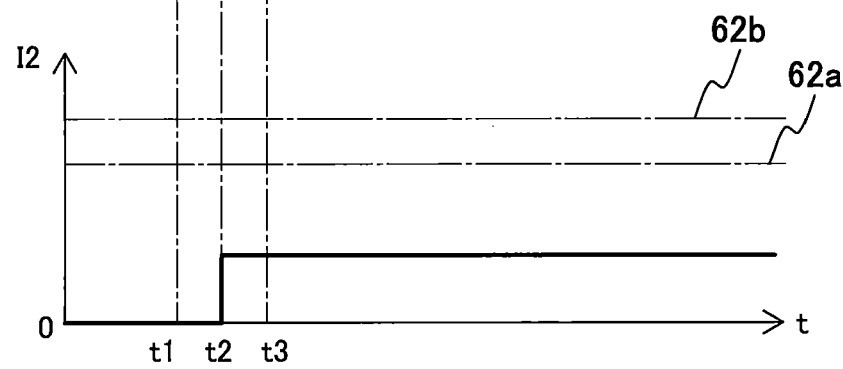
Figure 8C:
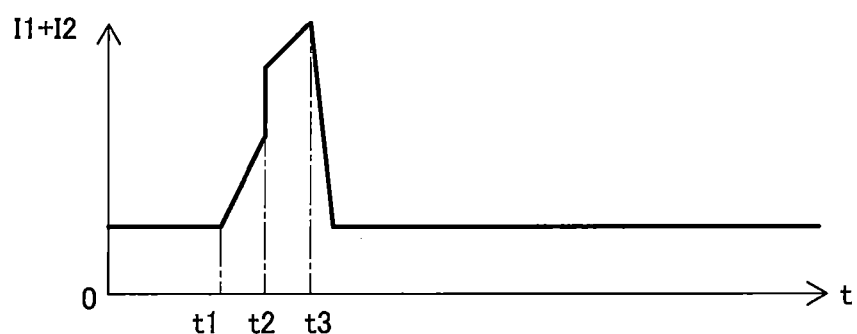

FIG. 8 shows time charts of a current of the semiconductor relay 1 set as I1 and a current of the semiconductor relay 2 set as I2, which are components of the semiconductor device 100. The horizontal axis represents time and represents arbitrary time. The vertical axis represents current value, FIG. 8(a) represents the current I1, FIG. 8(b) represents the current I2, and FIG. 8(c) represents the sum current (I1+I2) of the current I1 and the current I2. Note that FIGS. 8(a) and 8(b) illustrate overcurrent warning thresholds 61a and 62a and overcurrent diagnostic thresholds 61b and 62b, respectively.

The time chart starts from a state in which the operation mode of the semiconductor device 100 of the present example illustrated in FIG. 8 is set to the redundancy mode, the semiconductor relay 1 is in charge of the relay operation as the main system, and the switching element 40 is switched on. Note that, since the input/output common-setting signal 30b is not directly related to the description of the present operation, the input/output common-setting signal is at the L level here.

At the start of the time charts, the settings of the switches included in the input switching circuit 10 and the output switching circuit 20 correspond to the switch setting No. 1 of FIG. 4.

Focusing on the output switching circuit 20 in comparison with the configuration diagram of FIG. 3, the outputs 41a and 41b of the semiconductor relay 1, which is the main system, are connected to the outputs OUT1U and OUT1L when the switches SU11, SU12, SL11, and SL12 are switched on. On the other hand, the outputs 42a and 42b of the semiconductor relay 2, which is an alternative system, are electrically insulated from OUT1U and OUT1L when the switches SU21, SU3, SL21, and SL3 are switched off.

With reference to the time charts of FIG. 8 under the above assumption, it is assumed that the current value starts to increase at a time t1 due to a cause such as temporal degradation of the semiconductor relay 1. The current I1 of the semiconductor relay 1 continues to increase and reaches the overcurrent warning threshold 61a at a time t2. Then, the diagnosis unit 70 diagnoses that the semiconductor relay 1 is in the overcurrent warning state at the time t2 according to the diagnosis flow illustrated in FIG. 6, and changes the abnormality warning signal 71b from the L level to the H level (ST1-ST2-ST11).

By changing the output level of the abnormality warning signal 71b, the switch setting of the output switching circuit 20 transitions from No. 1 to No. 2 in the table of FIG. 4. In the switch setting No. 2, the switches SU21, SU3, SL21, and SL3 are further switched on as compared with the switch setting No. 1. As a result, the outputs 42a and 42b of the semiconductor relay 2, which is an alternative system, are connected to the outputs OUT1U and OUT1L of the semiconductor device 100. That is, since the outputs 41a and 41b of the semiconductor relay 1 and the outputs 42a and 42b of the semiconductor relay 2 are both connected to the outputs OUT1U and OUT1L of the semiconductor device 100 at the time t2, both the semiconductor relay 1 as the main system and the semiconductor relay 2 as the alternative system drive the load 90.

The current of the semiconductor relay 1 continues to increase from the time t2 and reaches the overcurrent diagnostic threshold 61b at a time t3. At this time, the diagnosis unit 70 diagnoses that the semiconductor relay 1 is in the overcurrent state according to the diagnosis flow illustrated in FIG. 6, and changes the abnormality diagnosis result 71a from the L level to the H level (ST1→S10). As described above, when the abnormality diagnosis result 71a reaches the H level, the switching element 40 of the semiconductor relay 1 is forcibly switched off, and only the semiconductor relay 2 is switched to drive the load 90.

Here, focusing on the sum current of the current I1 and the current I2 (I1+I2) illustrated in FIG. 8(c), there is no current blocking associated with the above operation, and the load 90 can be continuously driven in the time axis. As described above, even when an abnormality occurs in the semiconductor relay of the main system, the operation of switching to the alternative system can be performed without interrupting the relay function.

Second Embodiment of Present Invention

Next, a configuration and a function of a semiconductor device 100 according to a second embodiment of the present invention will be described with reference to FIG. 9.

In the second embodiment of the present invention illustrated in FIG. 9, a case where an abnormality occurs in the semiconductor relay of the main system when the operation mode of the semiconductor device 100 is set to the redundancy mode will be described. That is, the present embodiment is configured such that, in the operation of switching to the alternative system without temporally interrupting the relay function, the semiconductor relay control signals IN1 and IN2, which are inputs of the semiconductor device 100, and the output signal pairs OUT1 and OUT2, which are outputs of the semiconductor device 100, are also set to be dual systems, and thus the reliability is increased.

Also in the second embodiment, similarly to the first embodiment, the redundancy mode is an operation mode in which the semiconductor relay 1 among the two semiconductor relays which are some of the components of the semiconductor device 100 serves as a main system to perform a relay function of controlling a conductive or non-conductive state of the two points, and the semiconductor relay 2 serves as an alternative system to the semiconductor relay 1 in a functional standby state in preparation for an abnormality of the main system.

Figure 9:
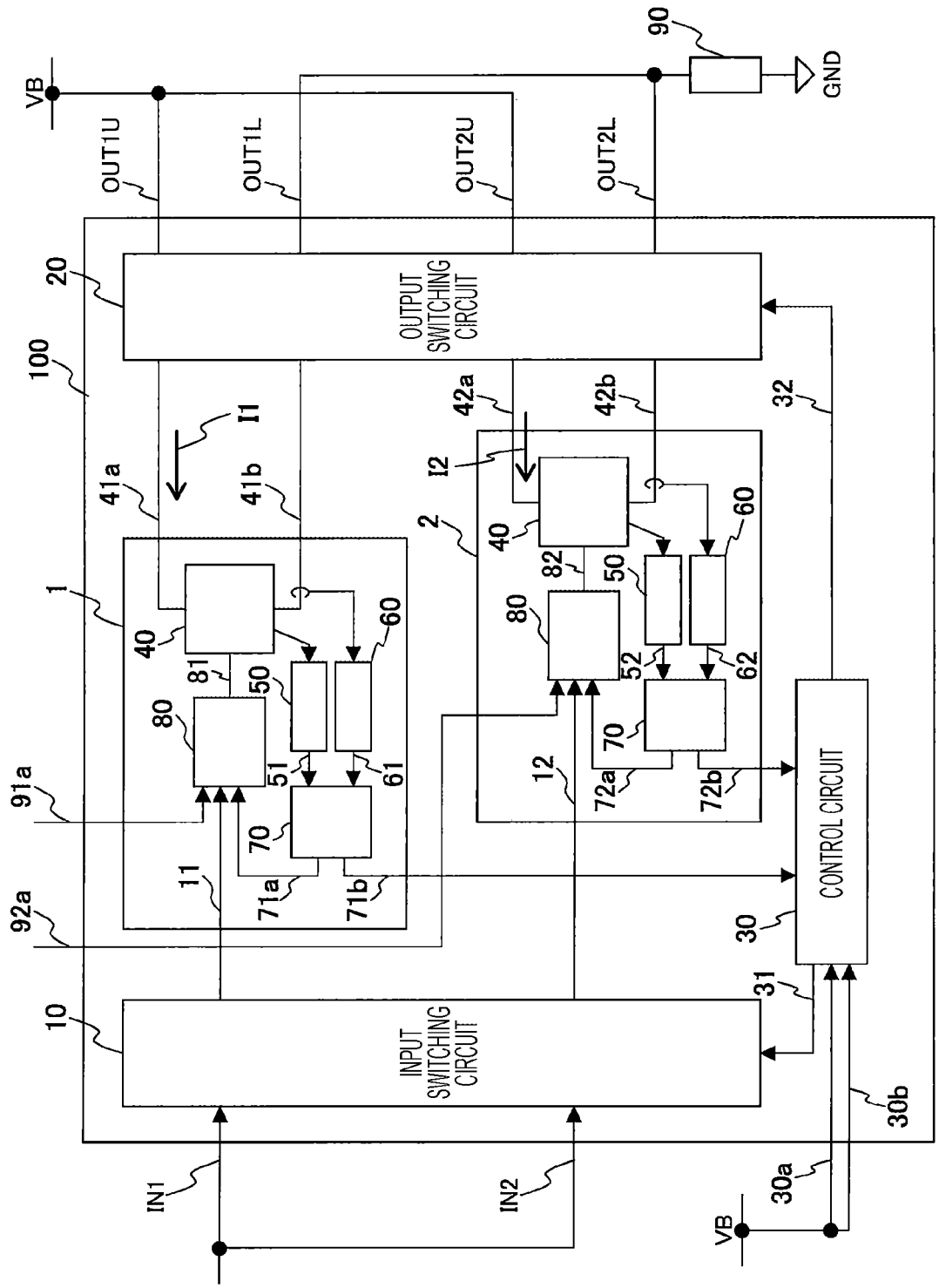
FIG. 9 is a block diagram illustrating an example of a configuration of a semiconductor device 100 according to a second embodiment of the present invention.

Also in the second embodiment illustrated in FIG. 9, in order to simplify the description, the semiconductor relay 1 is assumed to be a main system and the semiconductor relay 2 is assumed to be an alternative system, and the description overlapping with the first embodiment illustrated in FIG. 1 will be appropriately omitted.

There are three differences in configuration from the semiconductor device 100 according to the first embodiment as below. The first difference is that the input/output common-setting signal 30b is connected not to the ground potential GND but to the battery voltage VB, and the potential is fixed. The second difference is that the signals IN1 and IN2 are connected to each other outside the semiconductor device 100 in order to use the inputs of the semiconductor device 100 as a dual system. The third difference is that the output signal pairs OUT1 and OUT2 are connected to each other, and OUT1 and OUT2 are connected in parallel when viewed from the load 90 in order to use the outputs of the semiconductor device 100 as a dual system similarly to the inputs.

Similarly to the first embodiment illustrated in FIG. 1, in the semiconductor device 100 of the present embodiment, when the semiconductor relay 1 of the main system reaches the overtemperature warning state or the overcurrent warning state, the semiconductor relay 2 as the alternative system is also switched on so that both the semiconductor relay 1 and the semiconductor relay 2 are temporarily in charge of the relay function. Furthermore, according to the semiconductor device 100 of the present embodiment, even when the semiconductor relay 1 is finally forcibly switched off based on overtemperature diagnosis or overcurrent diagnosis, the semiconductor relay 2 continues the relay function without causing the relay function to be temporally interrupted. Note that, since the detailed operation can be described in the same manner as in the first embodiment, FIGS. 2 to 6 and 8 referred to in the description of the first embodiment can also be referred to as they are in the present embodiment.

A difference from the first embodiment illustrated in FIG. 1 is that the input/output common-setting signal 30b is at the H level, and thus the switch settings of the input switching circuit 10 and the output switching circuit 20 are No. 3 (normal state) and No. 4 (main system relay abnormal state) shown in FIG. 4. Note that the switch settings shown in FIG. 4 for the first embodiment are to No. 1 (normal state) and No. 2 (main system relay abnormal state) as described above. As a result, in comparison to the dual system of the relay function described in the first embodiment, the input/output units of the semiconductor device 100 is also formed in a dual system, and thus the semiconductor device 100 can continue operating even when disconnection occurs at one input or one output of the dual system.

As described above, in addition to the operation of switching to the alternative system without interrupting the relay function when an abnormality occurs in the semiconductor relay of the main system, the second embodiment is characterized in that the semiconductor relay control signals IN1 and IN2 which are inputs of the semiconductor device 100 and the output signal pairs OUT1 and OUT2 which are outputs of the semiconductor device 100 are also formed in a dual system to improve reliability.

Third Embodiment of Present Invention

In a third embodiment of the present invention, an operation in a case where the operation mode of the semiconductor device 100 is set to a non-redundancy mode will be described with reference to FIG. 10.

The non-redundancy mode in the third embodiment is an operation mode in which each of two semiconductor relays 1 and 2, which are a part of components of the semiconductor device 100, are independently in charge of a relay function of controlling a conductive or non-conductive state between the two points. This operation mode corresponds to a case where the L level is applied as a redundancy mode setting signal 30a.

In the non-redundancy mode, both the semiconductor relays 1 and 2 are main systems, and there is no alternative system. Therefore, in a case where it is diagnosed that there is an abnormality due to overtemperature or overcurrent, the abnormality can be dealt with a system requiring fail-safe using the semiconductor device 100 having the same configuration as the other embodiments by interrupting the relay function and stopping the operation.

Figure 10:
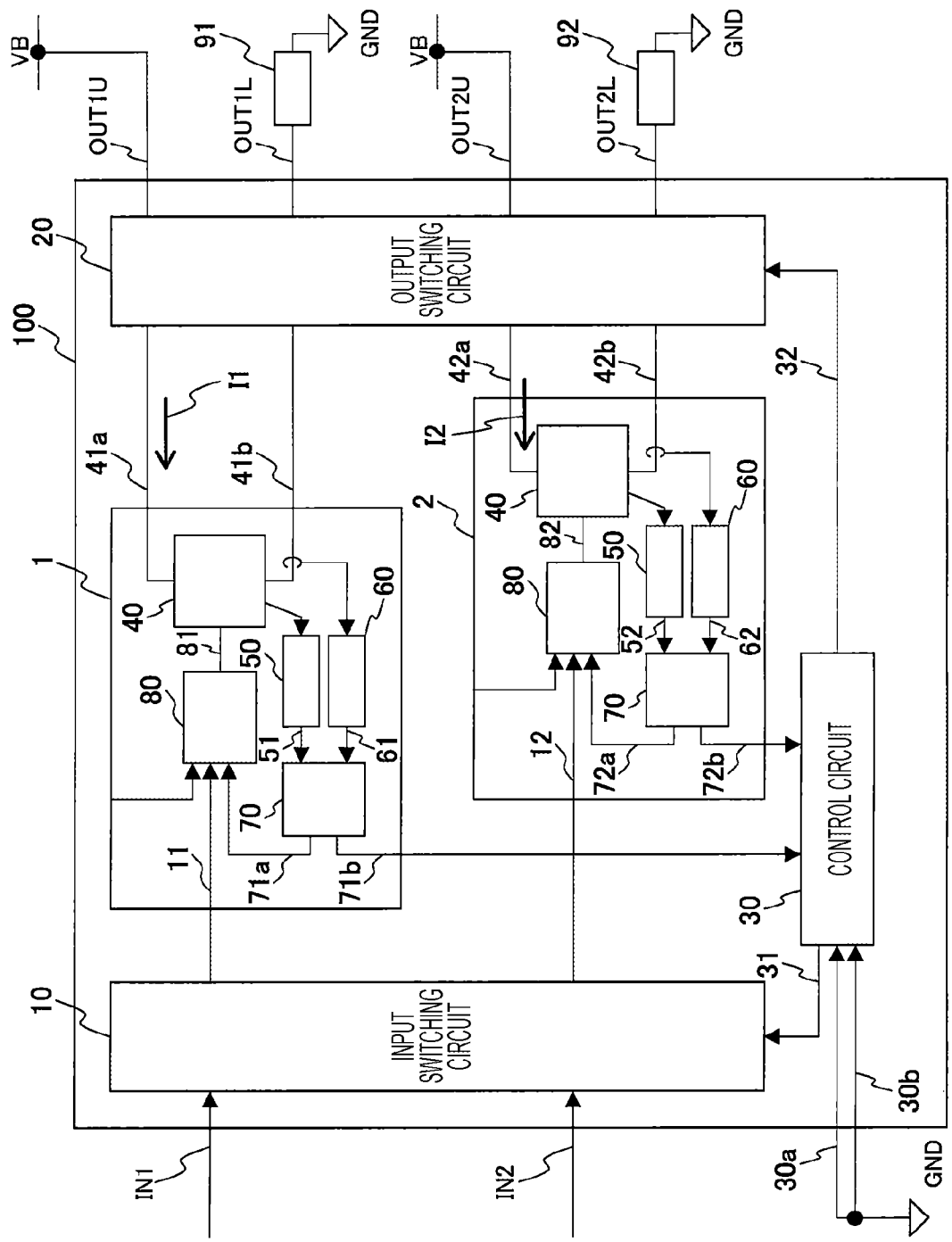
FIG. 10 is a block diagram illustrating an example of a configuration of a semiconductor device 100 according to a third embodiment of the present invention.

FIG. 10 is a block diagram illustrating an example of a configuration of a semiconductor device 100 according to the third embodiment of the present invention. The differences in configuration from the semiconductor device 100 according to the first embodiment are that the redundancy mode setting signal 30a is connected to GND and loads 91 and 92 are separately provided in the output unit in order to use the semiconductor relay 1 and the semiconductor relay 2 independently.

The switch settings of the input switching circuit 10 and the output switching circuit 20 of the semiconductor device 100 according to the present embodiment are No. 5 in light of the switch setting table of FIG. 4 since the redundancy mode setting signal 30a is at the L level. That is, the switches S3, SU3, and SL3 are in the OFF state. As a result, the input of the semiconductor relay 1 becomes IN1 and the output thereof becomes OUT1 (a pair of OUT1U and OUT1L), and the input of the semiconductor relay 2 becomes IN2 and the output thereof becomes OUT2 (a pair of OUT2U and OUT2L).

Next, an operation of immediately stopping the relay function when an abnormality occurs in a semiconductor relay in the present embodiment will be described. In the present embodiment, the semiconductor relay 1 and the semiconductor relay 2 operate independently, and operate independently as well in an operation stop process at the time of abnormality.

In addition, diagnosis of each of the semiconductor relays 1 and 2 follows the diagnosis flow illustrated in FIG. 6. Here, since the semiconductor relays 1 and 2 operate independently of each other, an example of a case where an abnormality occurs in the semiconductor relay 1 will be described.

Figure 11A:
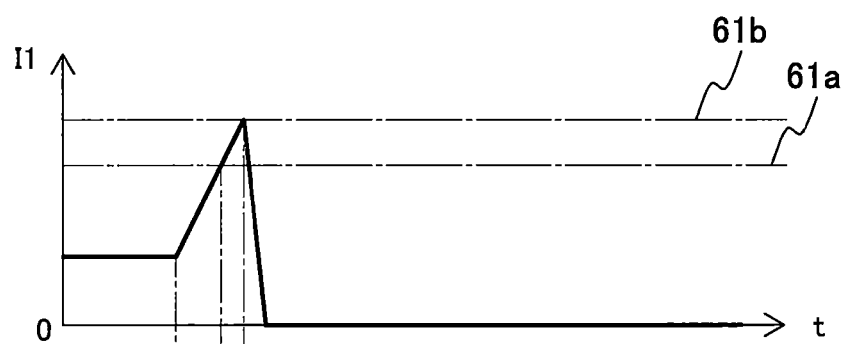
FIGS. 11A and 11B are time charts at the time of performing overcurrent diagnosis according to the third embodiment.
Figure 11B:
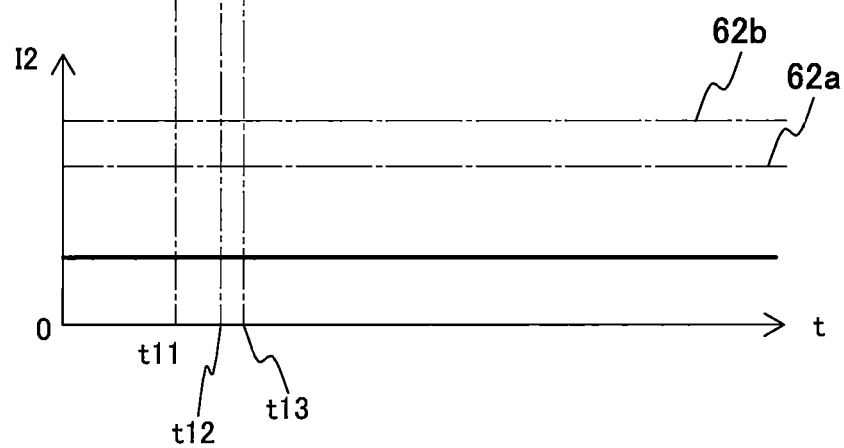

FIG. 11 is a time chart illustrating a current I1 of the semiconductor relay 1 and a current I2 of the semiconductor relay 2 in the present embodiment. FIG. 11(a) illustrates the current I1 and FIG. 11(b) illustrates the current I2 on the vertical axis, and FIGS. 11(a) and 11(b) illustrate overcurrent warning thresholds 61a and 62a and overcurrent diagnostic thresholds 61b and 62b, respectively.

It is assumed that the current value starts to increase at a time t11 in the time chart of FIG. 11 due to a cause such as temporal degradation of the semiconductor relay 1. When the current of the semiconductor relay 1 continuously increases and reaches the overcurrent warning threshold 61a at a time t12, the diagnosis unit 70 diagnoses that the semiconductor relay 1 is in the overcurrent warning state according to the diagnosis flow illustrated in FIG. 6, and changes the abnormality warning signal 71b from the L level to the H level (ST1-ST2-ST11) at the time t12.

However, in the switch setting table of FIG. 4, since the mode is the non-redundancy mode (the redundancy mode setting signal 30a is at the L level), the abnormality warning signal 71b is irrelevant to the switch control, and the ON state of the semiconductor relay 1 continues.

The current I1 of the semiconductor relay 1 continues to increase from the time t12 and reaches the overcurrent diagnostic threshold 61b at a time t13. At this time, the diagnosis unit 70 diagnoses that the semiconductor relay 1 is in the overcurrent state according to the diagnosis flow of FIG. 6, and changes the abnormality diagnosis result 71a from the L level to the H level (ST1-S10). Then, when the abnormality diagnosis result 71a becomes the H level, the switching element 40 of the semiconductor relay 1 is forcibly switched off, and the driving of the load 91 is stopped. The operation of the semiconductor relay 2 is continued regardless of whether there is an abnormality in the semiconductor relay 1 in the non-redundancy mode.

As described above, even when an abnormality occurs in the semiconductor relay in the non-redundancy mode, the operation of immediately stopping the relay function can be performed.

Fourth Embodiment of Present Invention

In a fourth embodiment of the present invention, a semiconductor integrated circuit in which the semiconductor devices 100 described in the first to third embodiments are integrated will be described with reference to FIG. 12. Here, in particular, a description will be given of a means for avoiding electrical breakdown, rupture, or combustion that may cause a common cause failure, which is a problem when functions including a redundancy configuration based on a main system and an alternative system are integrated into an integrated circuit.

Figure 12:
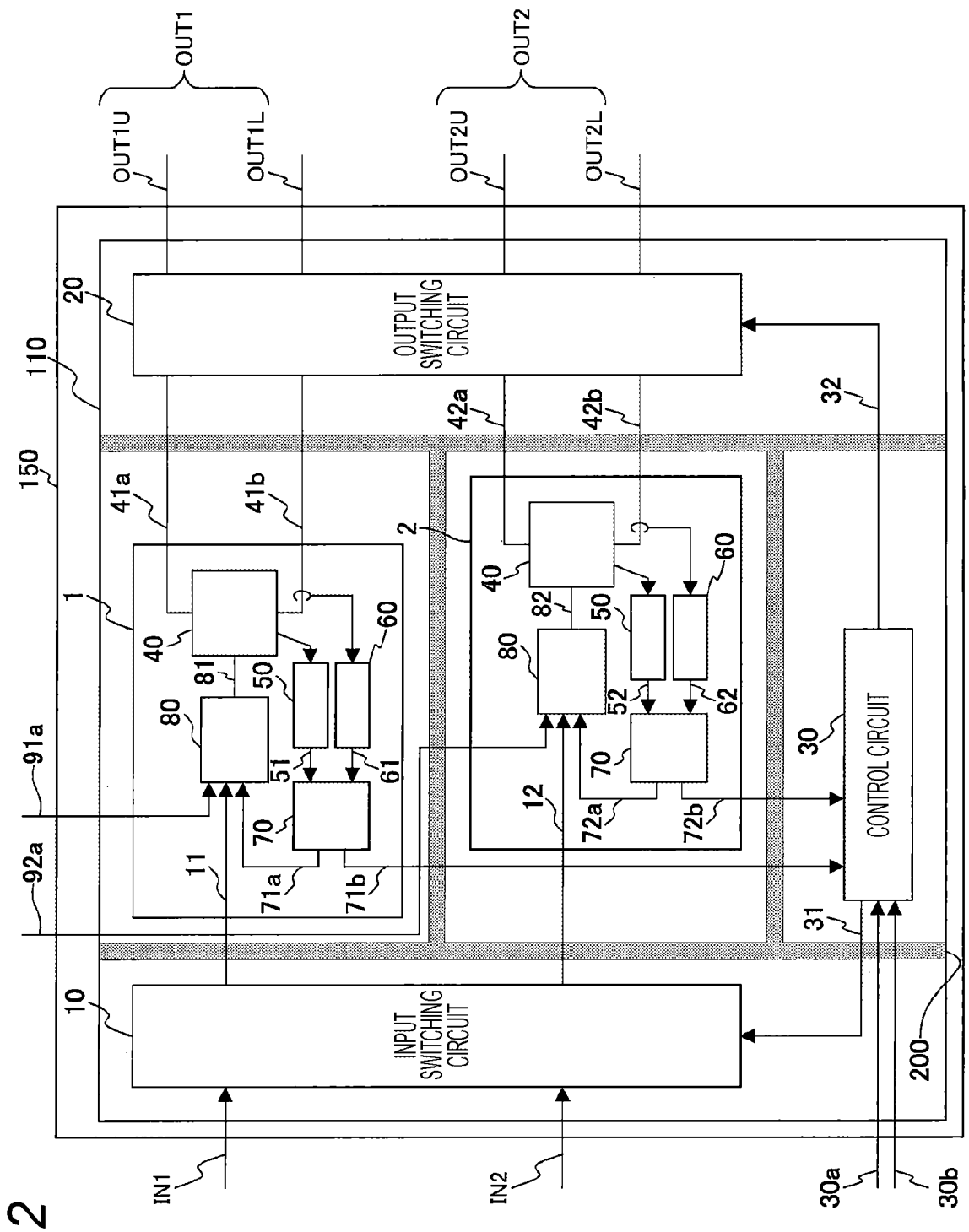
FIG. 12 is a block diagram of a semiconductor integrated circuit 150 according to a fourth embodiment of the present invention.

FIG. 12 illustrates an example of a semiconductor integrated circuit 150 according to a fourth embodiment of the present invention. The semiconductor integrated circuit 150 of the present embodiment includes a silicon on insulator (SOI) substrate 110, and a semiconductor relay 1, a semiconductor relay 2, an input switching circuit 10, an output switching circuit 20, and a control circuit 30 are integrated on the SOI substrate. In addition, the components mounted on the SOI substrate are electrically separated from each other by an element isolation film 200 made of silicon dioxide ($SiO_2$) as an insulator.

As illustrated in FIG. 12, each component mounted on the SOI substrate 110 is formed on a silicon surface electrically isolated by the element isolation film 200. Here, there may be a case where an electrical stress is applied to the semiconductor relay 1 from the outside of the integrated circuit 150, causing electrical breakdown in the semiconductor relay 1, and electrical damage such as a short circuit occurs on the silicon surface. However, even in such a case, by electrically isolating each component by the element isolation film 200, electrical damage of one component affecting another component on the SOI substrate 110 can be excluded. Therefore, it is possible to prevent common cause failure from affecting other components.

Figure 13:
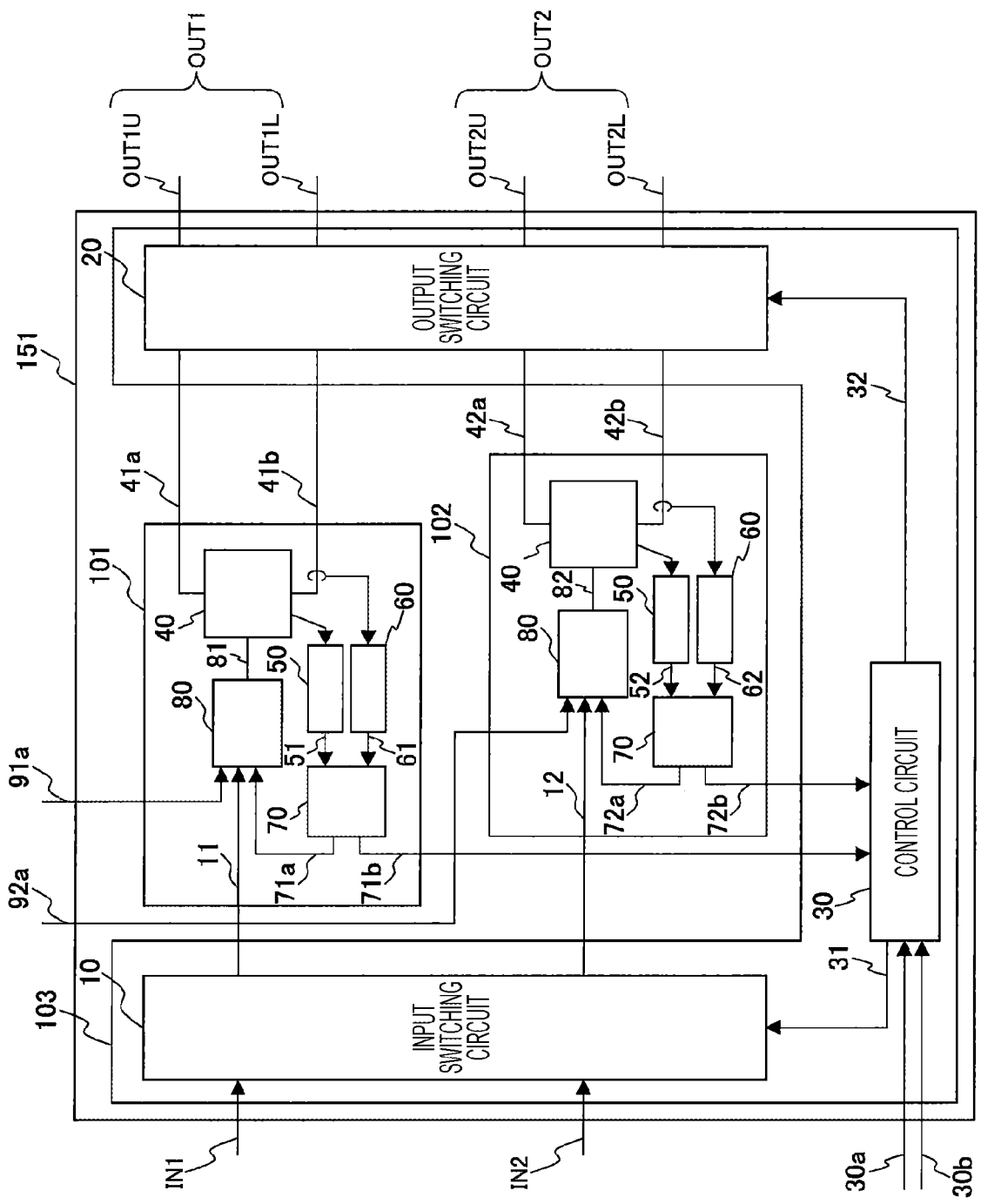
FIG. 13 is a block diagram of a semiconductor integrated circuit 151 according to a modified example of the fourth embodiment of the present invention.

Furthermore, as a common cause failure avoidance means in the fourth embodiment, a semiconductor integrated circuit 151 according to another embodiment a modified example as illustrated in FIG. 13 is also conceivable. In a semiconductor integrated circuit 151 as a modified example of the fourth embodiment illustrated in FIG. 13, a semiconductor relay 1 is formed as a semiconductor relay chip 101 integrated on a silicon substrate, and a semiconductor relay 2 is formed as a semiconductor relay chip 102 integrated on a silicon substrate different from that of the semiconductor relay 1. In addition, a peripheral circuit chip 103 in which an input switching circuit 10, an output switching circuit 20, and a control circuit 30 are integrated is provided on a silicon substrate different from the semiconductor relay chips 101 and 102. As described above, the modified example of the fourth embodiment is characterized by having a system in package (SIP) structure in which the chips 101 to 103 are sealed in the same resin package.

Since each of the chips 101 to 103 in the SIP structure is mounted at a different position in the resin package, separation by a physical distance based on the difference in mounting position and electrical separation can be compatible.

For example, even in a case where the semiconductor relay chip 101 is electrically broken by application of electrical stress, propagation of electrical failure to another chip can be avoided. In addition, even when a failure accident such as rupture or combustion occurs in the semiconductor relay chip 101 due to rapid heat generation or a high current, a failure of other chips separated by a physical distance can be prevented.

According to the semiconductor device of the present embodiment, it is possible to avoid a common cause failure starting from a failure of a certain component, which is a problem in a case where functions including a redundancy configuration based on a main system and an alternative system are integrated into an integrated circuit as described above.

Note that, in the description of the drawings, control lines and information lines considered to be necessary for the description are illustrated, and not all control lines and information lines for a product are necessarily illustrated. In addition, the present invention is not limited to the above-described embodiments, and includes various application examples and modified examples without departing from the description of the claims. For example, the above-described embodiments have been described in detail in order to help understanding of the present invention, and are not necessarily limited to those having all the described configurations. In addition, a part of the configuration of an embodiment can be replaced with the configuration of another embodiment, and further the configuration of an embodiment can be added to the configuration of another embodiment. In addition, it is also possible to add, delete, and replace other configurations as a part of the configuration of each embodiment.

REFERENCE SIGNS LIST 100 semiconductor device
101, 102 semiconductor relay chip
103 peripheral circuit chip
110 SOI substrate
150, 151 semiconductor integrated circuit
200 element isolation film
1, 2 semiconductor relay
10 input switching circuit
11, 12 drive signal
20 output switching circuit
30 control circuit
30a redundancy mode setting signal
30b input/output common-setting signal
31 input unit control signal
32 output unit control signal
40 switching element
41a, 41b, 42a, 42b semiconductor relay output
50 temperature sensor
51, 52 temperature detection result
51a overtemperature warning threshold
51b overtemperature diagnostic threshold
60 temperature sensor
61, 62 current detection result
61a, 62a overcurrent warning threshold
61b, 62b overcurrent diagnostic threshold
70 diagnosis unit
71a, 72a abnormality diagnosis result
71b, 72b abnormality warning signal
80 drive circuit
81, 82 switching element control signal
90, 91, 92 load circuit
91a, 92a emergency stop signal
IN1, IN2 semiconductor relay control signal OUT1, OUT2 output signal pair
S1, S2, S3, SU11, SU12, SU21, SU22, SU3, SU11, SU12, SU21, SU22, SU3 switch

The invention claimed is:

1. A semiconductor device comprising:
a first semiconductor relay and a second semiconductor relay connected in parallel to each other;
an input switching circuit which switches a path of a signal input to the first and second semiconductor relays;
an output switching circuit which switches a path of a signal output from the first and second semiconductor relays;
a monitoring unit which performs abnormality detection and warning for the first and second semiconductor relays; and
a control circuit which executes one of a redundancy mode in which the input switching circuit is controlled such that inputs of the first and second semiconductor relays are shared in response to a first setting signal from an outside and the output switching circuit is controlled such that only one of the first and second semiconductor relays performs output and a non-redundancy mode in which the input switching circuit and the output switching circuit are controlled such that inputs and outputs of the first and second semiconductor relays are different from each other.

2. The semiconductor device according to claim 1, wherein the output switching circuit is controlled by the control circuit such that, in the redundancy mode, outputs of both the first and second semiconductor relays are shared in response to a warning from the monitoring unit.

3. The semiconductor device according to claim 1, wherein
each of the first and second semiconductor relays includes:
a switching element;
a drive circuit which drives the switching element; and
the monitoring unit, and
the switching element is blocked by the drive circuit in response to an output of the monitoring unit.

4. The semiconductor device according to claim 1, wherein the monitoring unit includes
a temperature detector which detects temperatures of the switching elements of the first and second semiconductor relays,
a current detector which detects a current flowing through the switching elements, and
a diagnosis unit which detects an overtemperature and/or an overcurrent as an abnormality of the switching elements based on temperature information from the temperature detector and/or current information from the current detector, and warns about the overtemperature and/or the overcurrent before the switching elements reach abnormality based on the temperature information from the temperature detector and/or the current information from the current detector.

5. The semiconductor device according to claim 4, wherein the control circuit further controls the input switching circuit and the output switching circuit such that, in the redundancy mode, inputs and outputs of the first and second semiconductor relays are made into a dual system in response to a second setting signal from the outside.

6. An integrated circuit of a semiconductor device including a first semiconductor relay and a second semiconductor relay connected in parallel to each other, an input switching circuit which switches a path of a signal input to the first and second semiconductor relays, an output switching circuit which switches a path of a signal output from the first and second semiconductor relays, a monitoring unit which performs abnormality detection and warning for the first and second semiconductor relays, and a control circuit which executes one of a redundancy mode in which the input switching circuit is controlled such that inputs of the first and second semiconductor relays are shared in response to a first setting signal from an outside and the output switching circuit is controlled such that only one of the first and second semiconductor relays performs output and a non-redundancy mode in which the input switching circuit and the output switching circuit are controlled such that inputs and outputs of the first and second semiconductor relays are different from each other, wherein
the first semiconductor relay, the second semiconductor relay, the input switching circuit, the output switching circuit, and the control circuit are integrated on one SOI substrate, and
each of components to be integrated are electrically separated from each other by an element isolation film made of silicon dioxide on the SOI substrate.

7. An integrated circuit of a semiconductor device including a first semiconductor relay and a second semiconductor relay connected in parallel to each other, an input switching circuit which switches a path of a signal input to the first and second semiconductor relays, an output switching circuit which switches a path of a signal output from the first and second semiconductor relays, a monitoring unit which performs abnormality detection and warning for the first and second semiconductor relays, and a control circuit which executes one of a redundancy mode in which the input switching circuit is controlled such that inputs of the first and second semiconductor relays are shared in response to a first setting signal from an outside and the output switching circuit is controlled such that only one of the first and second semiconductor relays performs output and a non-redundancy mode in which the input switching circuit and the output switching circuit are controlled such that inputs and outputs of the first and second semiconductor relays are different from each other, wherein a first semiconductor relay chip in which the first semiconductor relay is integrated, a second semiconductor relay chip in which the second semiconductor relay is integrated, and a peripheral circuit chip in which the input switching circuit, the output switching circuit, and the control circuit are integrated are sealed in a same package.

\* \* \* \* \*